(12) United States Patent
Wang et al.

(10) Patent No.: US 7,327,541 B1
(45) Date of Patent: Feb. 5, 2008

(54) OPERATION OF DUAL-DIRECTIONAL ELECTROSTATIC DISCHARGE PROTECTION DEVICE

(75) Inventors: Albert Z. H. Wang, Santa Clara, CA (US); Chen H. Tsay, San Jose, CA (US); Peter Deane, Los Altos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/873,031

(22) Filed: Jun. 22, 2004

Related U.S. Application Data

(60) Division of application No. 10/045,137, filed on Oct. 23, 2001, now abandoned, which is a continuation of application No. 09/100,384, filed on Jun. 19, 1998, now Pat. No. 6,365,924.

(51) Int. Cl.
*H02H 9/00* (2006.01)
*H02H 3/00* (2006.01)
*H01L 29/74* (2006.01)
*H01L 23/62* (2006.01)
*H01L 21/332* (2006.01)

(52) U.S. Cl. .......................... 361/56; 361/51; 257/110; 257/355; 438/133

(58) Field of Classification Search ........ 438/133–140, 438/129; 257/110, 112, 152, 162, 355–356, 257/173, 125, 122; 361/51, 56
See application file for complete search history.

(56) References Cited

U.S. PATENT DOCUMENTS

| | | | |
|---|---|---|---|
| 3,140,963 A | 7/1964 | Svedberg et al. | 148/33.5 |
| 3,427,512 A | 2/1969 | Mapother | 257/162 |
| 3,437,891 A | 4/1969 | Yamashita | 257/112 |
| 3,890,543 A | 6/1975 | Jonassen | 361/81 |
| 3,904,931 A | 9/1975 | Leidich | 317/16 |
| 4,109,274 A | 8/1978 | Belenkov et al. | 257/110 |
| 4,400,711 A | 8/1983 | Avery | 357/43 |
| 4,484,244 A | 11/1984 | Avery | 361/56 |
| 4,543,593 A | 9/1985 | Fujita | 357/48 |
| 4,567,500 A | 1/1986 | Avery | 357/38 |
| 4,581,626 A | 4/1986 | Krishna et al. | 257/164 |
| 4,595,941 A | 6/1986 | Avery | 357/43 |
| 4,622,568 A | 11/1986 | Schutten et al. | 257/122 |
| 4,633,283 A | 12/1986 | Avery | 357/23 |
| 4,870,530 A | 9/1989 | Hurst et al. | 361/91 |
| 4,947,226 A * | 8/1990 | Huang et al. | 257/122 |
| 4,967,256 A | 10/1990 | Pathak et al. | 257/112 |
| 5,012,317 A * | 4/1991 | Rountre | 257/173 |

(Continued)

OTHER PUBLICATIONS

Gray et al, *Analysis and Design of Analog Integrated Circuits* (John Wiley & Sons), 1977, pp. 197-210.

*Primary Examiner*—Shouxiang Hu
(74) *Attorney, Agent, or Firm*—Ronald J. Meetin

(57) ABSTRACT

A two-terminal ESD protection structure formed by an arrangement of five adjacent semiconductor regions (112, 114, 116, 118, and 120) of alternating conductivity type provides protection against both positive and negative ESD voltages. The middle semiconductor region electrically floats. When the two terminals (A and K) of the ESD protection structure are subjected to an ESD voltage, the structure goes into operation by triggering one of its two inherent thyristors (170 and 180) into a snap-back mode that provides a low impedance path through the structure for discharging the ESD current.

40 Claims, 10 Drawing Sheets

U.S. PATENT DOCUMENTS

| | | |
|---|---|---|
| 5,140,401 A | 8/1992 | Ker et al. .................... 357/43 |
| 5,359,211 A | 10/1994 | Croft .......................... 257/173 |
| 5,392,185 A * | 2/1995 | Haas et al. .................. 361/56 |
| 5,400,202 A | 3/1995 | Metz et al. ................... 361/56 |
| 5,430,595 A | 7/1995 | Wagner et al. ............... 361/56 |
| 5,455,436 A | 10/1995 | Cheng ........................ 257/356 |
| 5,465,189 A | 11/1995 | Polgreen et al. ............. 361/58 |
| 5,561,577 A | 10/1996 | Motley ........................ 361/56 |
| 5,572,394 A * | 11/1996 | Ker et al. .................... 361/56 |
| 5,574,618 A | 11/1996 | Croft .......................... 361/212 |
| 5,576,557 A | 11/1996 | Ker et al. .................... 257/173 |
| 5,576,570 A | 11/1996 | Ohsawa et al. ............. 257/369 |
| 5,600,525 A | 2/1997 | Avery .......................... 361/56 |
| 5,602,404 A | 2/1997 | Chen et al. .................. 257/112 |
| 5,719,733 A * | 2/1998 | Wei et al. .................... 361/56 |
| 5,793,066 A | 8/1998 | Ajit ............................. 257/152 |
| 5,808,326 A | 9/1998 | Bernier et al. .............. 257/109 |
| 5,844,280 A * | 12/1998 | Kim ............................ 257/355 |
| 5,895,940 A * | 4/1999 | Kim ............................ 257/173 |
| 5,905,288 A * | 5/1999 | Ker ............................. 257/355 |

* cited by examiner

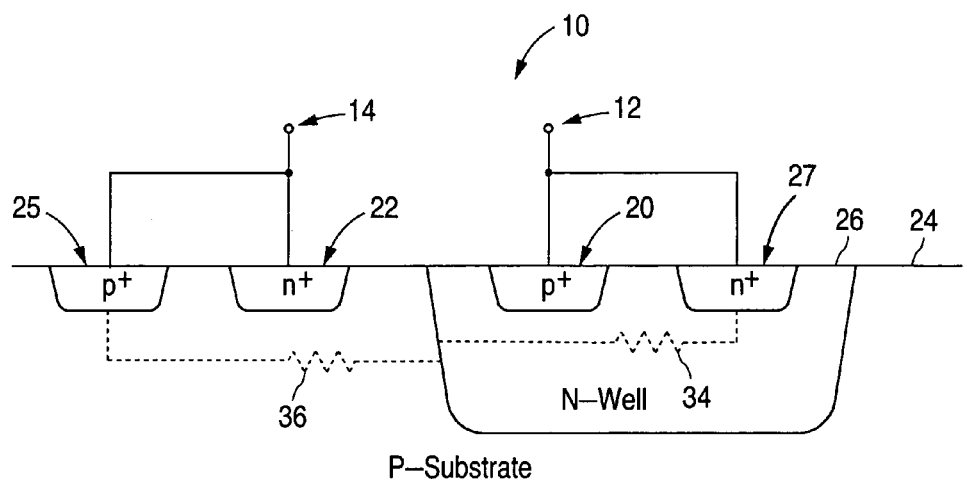
Fig. 1A
(PRIOR ART)
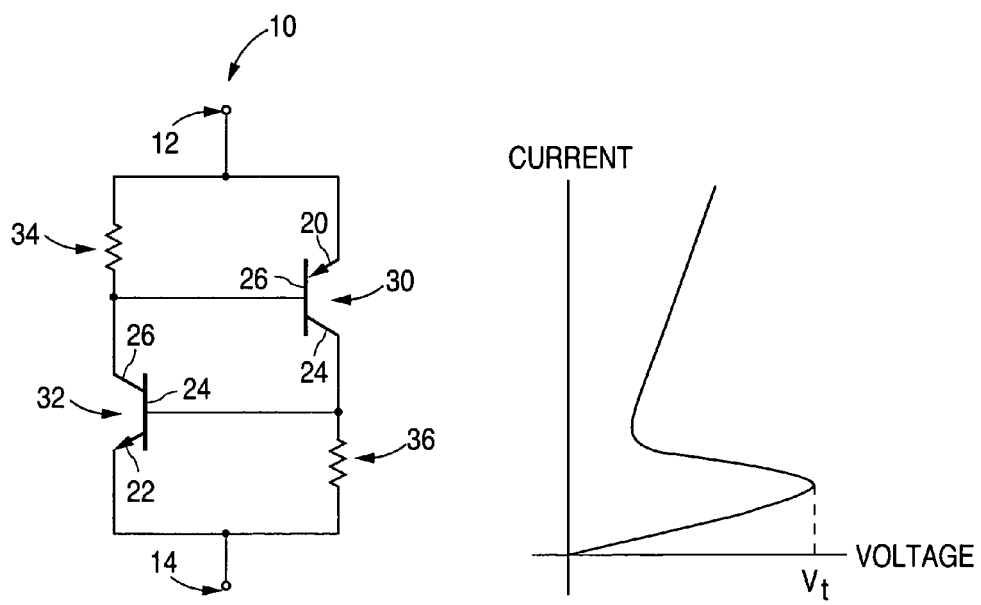
Fig. 1B
(PRIOR ART)
Fig. 1C
(PRIOR ART)

OPERATION OF DUAL-DIRECTIONAL ELECTROSTATIC DISCHARGE PROTECTION DEVICE

CROSS-REFERENCE TO RELATED APPLICATIONS

This is a division of U.S. patent application Ser. No. 10/045,137, filed 23 Oct. 2001, now abandoned, which is a continuation of U.S. patent application Ser. No. 09/100,384, filed 19 Jun. 1998, now U.S. Pat. No. 6,365,924 B1.

BACKGROUND OF THE INVENTION

The present invention relates to an electrostatic discharge protection structure.

It is well known that semiconductor Integrated Circuits (ICs) may be damaged by Electro-Static Discharge (ESD). Four different causes are identified to be responsible for the ESD phenomenon. The first cause, due to the human body, results from electrostatic stress exerted on an IC when a human carrying electrostatic charges touches the lead pins of the IC. The second cause, due to handling by a machine, results from electrostatic discharge that occurs when a machine carrying electrostatic charges comes into contact with the lead pins of an IC. The third cause, due to charged devices, results from the ESD current spike generated when an IC's lead pins carrying electrostatic charges are grounded during the handling of the IC. The fourth cause, due to induced electric fields, results from the electric field that an IC is exposed to which may produce an ESD in the IC when the IC is later grounded.

Efforts directed at scaling down CMOS processing technologies in order to produce ICs containing transistors with thinner gate oxides and ever decreasing channel dimensions must go hand in hand with development of new structures to protect the ICs against ESD. Therefore, the need continues to exist to reliably protect deep submicron CMOS ICs from the potential damages of ESD.

A well known structure for protecting an IC against ESD damage is a Semiconductor (or Silicon) Controlled Rectifier (SCR), also known as a thyristor. FIG. 1A shows a cross-sectional view of a typical lateral SCR 10 which has an anode terminal 12 and a cathode terminal 14. FIG. 1B shows a circuit schematic representation of SCR 10. As is seen from FIG. 1B, SCR 10 is composed of an npn bipolar transistor 32, a pnp bipolar transistor 30 and two parasitic resistors 34 and 36. Pnp transistor 30 consists of $p^+$ emitter region 20, n-well region 26 serving as base, and p-substrate region 24 serving as collector. Npn transistor 32 consists of $n^+$ emitter region 22, p-substrate region 24 serving as base, and n-well region 26 serving as collector. Parasitic resistor 34, shown in dashed line in FIG. 1A, is connected to anode terminal 12 via $n^+$ contact portion 27 of n-well 26. Parasitic resistor 36, likewise shown in dashed line in FIG. 1A, is connected to cathode terminal 14 via $p^+$ contact portion 25 of p-substrate 24.

In order to turn on SCR 10, a positive voltage must be applied between anode terminal 12 and cathode terminal 14 to forward bias both transistors 30 and 32. When SCR 10 turns on, a low impedance discharge path forms between the two terminals of SCR 10 to discharge the current.

FIG. 1C shows the current-voltage characteristic of SCR 10. In FIG. 1C, the vertical axis represents the current flow between terminals, and the horizontal axis represents the voltage across terminals 12 and 14. The voltage at which SCR 10 enters the region characterized by a negative current-voltage relationship is called the snap-back or trigger voltage, which is shown in FIG. 1C as $V_t$.

A major disadvantage of SCR 10 is that it provides protection against ESD in only one direction, i.e., either against a positive voltage/current pulse or against a negative voltage/current pulse. Consequently, to protect an IC against ESD, one SCR must be disposed between each input/output pad of the IC and the positive supply voltage and one SCR must be disposed between each input/output pad and the negative supply voltage. Alternatively, an IC is protected against ESD damage by a SCR which provides an active discharge path in one supply direction (positive or negative) and which provides a discharge path through parasitic diodes in the other supply direction. Therefore, what is needed is a single ESD protection structure capable of protecting an IC against both positive and negative ESD pulses.

FIG. 1D shows a top view of SCR 10 constructed using conventional layout techniques. The rectangular shape of $p^+$ region 20 or $n^+$ region 22 is known in the art as a finger structure. When an ESD pulse appears across anode terminal 12 and cathode terminal 14, current enters into or departs from $p^+$ region 20 and $n^+$ region 22 from across only a single edge of each of the fingers, designated in FIG. 1D with solid arrows 40. In order to increase the current handling capability—hence to improve the ESD performance of SCR 10—prior art layout techniques add more $n^+$ fingers in p-type substrate 24 and more $p^+$ fingers in n-well 26. However, by thus adding more $p^+$ and $n^+$ fingers, a significant amount of semiconductor surface area is occupied without a proportional increase in the ESD performance of the resulting structure. This is because, the current flow between each pair of newly added $p^+$ and $n^+$ fingers is limited to a component crossing only a single edge of each of the added fingers. It is, therefore, advantageous to develop an ESD layout structure which provides for current flow across more edges of the $p^+$ and $n^+$ fingers.

SUMMARY OF THE INVENTION

An Electro-Static Discharge (ESD) protection structure, in accordance with the present invention, protects an Integrated Circuit (IC) against both positive and negative ESD pulses.

The present ESD protection structure has an anode terminal and a cathode terminal and is composed of five semiconductor regions of alternating conductivity type. In one embodiment, the five regions form an n-p-n-p-n device. The ESD structure in this embodiment includes one pnp bipolar transistor and two npn bipolar transistors along with four parasitic resistors.

When the voltage potential of an ESD pulse appearing across the two terminals of the preceding embodiment of the present ESD protection structure exceeds the reverse breakdown voltage of the collector-base junction of the pnp transistor, electron-hole pairs are generated. The holes thus generated flow toward the cathode terminal, forcing the npn transistor whose emitter region is connected to the cathode terminal to turn on. Subsequently, the ESD protection structure enters into a snap-back mode, thereby to form a low impedance current discharge path between the two terminals to discharge the ESD current. The trigger voltage of the of the preceding embodiment of the present ESD protection structure is hence determined by the reverse-breakdown voltage of the collector-base junction of the pnp transistor.

Some embodiments of the ESD protection structure of the present invention are formed by combining a number of standard cells, in accordance with the invention. The standard cells which include a center cell, an edge cell and a corner cell are arranged adjacent each other in a particular fashion to form a square-shaped n-p-n-p-n ESD protection structure which provides a low impedance current discharge path from many locations therein. Accordingly, the square-shaped ESD protection structure thus formed has an enhanced current handling capability. Advantageously, the number of standard cells used to construct a square-shaped ESD protection structure may be varied as desired to increase or decrease the amount of the current that is discharged.

BRIEF DESCRIPTION OF THE DRAWINGS

FIG. 1A shows a cross-sectional view of a lateral SCR device as known in the prior art.

FIG. 1B shows a circuit schematic view of the lateral SCR device of FIG. 1A.

FIG. 1C shows the current-voltage characteristic of the lateral SCR device of FIG. 1A.

DETAILED DESCRIPTION OF THE INVENTION

Figure 1D:
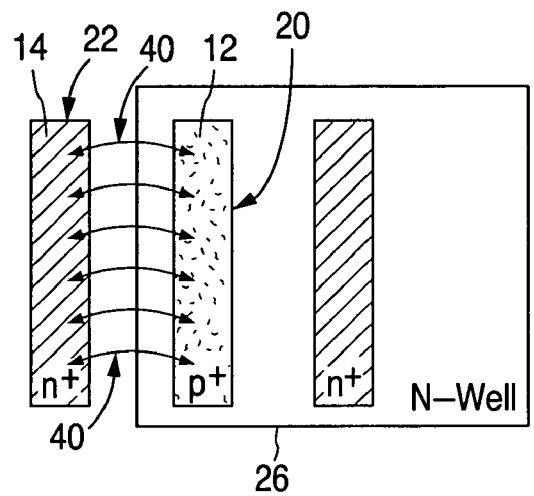
FIG. 1D shows a top view of the lateral SCR device of FIG. 1A.
Figure 2:
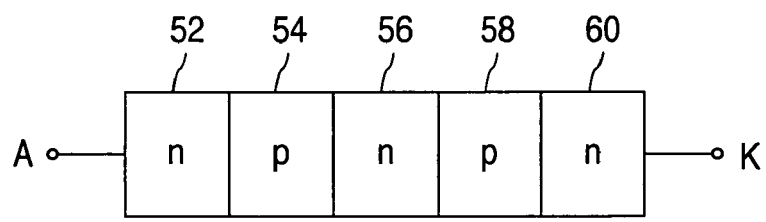
FIG. 2 shows the various semiconductor regions of a two-terminal dual-direction ESD protection structure, in accordance with the present invention.

A dual-direction Electro-Static Discharge (ESD) protection structure 50, in accordance with the present invention, is shown in FIG. 2. ESD protection structure 50 is composed of three n-type semiconductor regions 52, 56 and 60 and two p-type semiconductor regions 54 and 58. P-type region 54 is disposed between n-type regions 52 and 56. P-type region 58 is disposed between n-type regions 56 and 60. Consequently, structure 50 is formed by an alternating arrangement of adjacent n-p-n-p-n semiconductor regions. Anode terminal A is in electrical contact with n-type region 52 and cathode terminal K is in electrical contact with n-type region 60.

Figure 3:
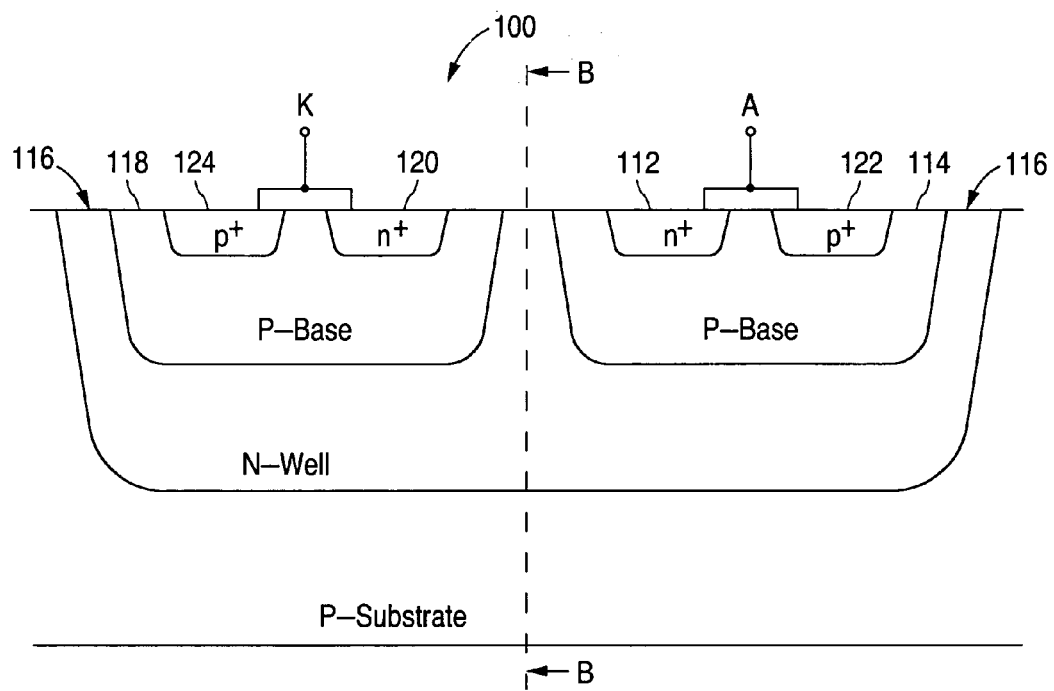
FIG. 3 shows a cross-sectional view of the dual-direction ESD protection structure of the present invention, fabricated in a standard CMOS process technology.

FIG. 3 shows a cross sectional view of ESD protection structure 100 of the present invention, fabricated using a standard CMOS process technology. P-base 114 is disposed between $n^+$ region 112 and n-well 116. Similarly, p-base 118 is disposed between $n^+$ region 120 and n-well region 116. Anode terminal A is formed over and is in electrical contact with $n^+$ region 112 and $p^+$ region 122. Cathode terminal K is formed over and is in electrical contact with $n^+$ region 120 and $p^+$ region 124. As is seen from FIG. 3, structure 100 has a symmetrical geometrical construct. Hence, a cut along line BB in FIG. 3 divides structure 100 into two physically indistinguishable parts. Because of this symmetry, ESD protection structure 100 operates without regard to the polarity of an ESD pulse appearing across its two terminals A and K, thereby, rendering the two terminals A and K fully interchangeable. CMOS technology fabrication processing steps required to manufacture embodiment 100 are well known in the art.

Figure 4:
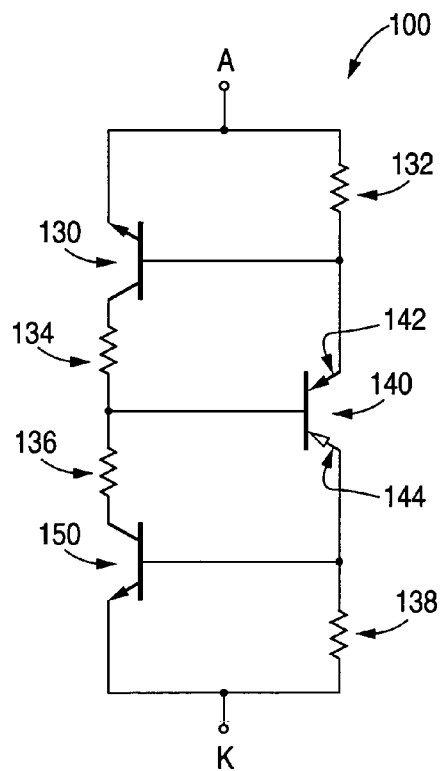
FIG. 4 shows a circuit schematic view of the ESD protection structure of FIG. 3.

FIG. 4 shows a circuit schematic view of embodiment 100 of the present invention. Concurrent reference to FIGS. 3 and 4 assists the reader in understanding the discussion below. $N^+$ region 112, p-base 114 and n-well 116 of FIG. 3 form the emitter, base and collector regions of npn bipolar transistor 130 of FIG. 4, respectively. $N^+$ region 120, p-base 118 and n-well 116 of FIG. 3 form the emitter, base and collector regions of npn bipolar transistor 150 of FIG. 4, respectively. N-well 116 forms the base region of pnp bipolar transistor 140.

If a positive voltage or current pulse is applied across terminals A and K of ESD protection structure 100, pnp transistor 140 and npn transistor 150 turn on while npn transistor 130 remains off. Accordingly, p-base 118 forms the collector region of pnp transistor 140 and p-base 114 forms the emitter region of transistor 140, shown in FIG. 4 by solid arrow 142.

If a negative voltage or current pulse is applied across terminals A and K of ESD protection structure 100, pnp transistor 140 and npn transistor 130 turn on while npn transistor 150 remains off. Accordingly p-base 114 forms the collector region of pnp transistor 140 and p-base 118 forms the emitter region of transistor 140, shown in FIG. 4 by hollow arrow 144.

Resistor 132 represents the resistance of the p-base 114 disposed between $p^+$ region 122 and n-well 116. Resistors 134 and 136 represent the resistances of the n-well region 116. Resistor 134 is located across the base region of transistor 140 and the collector region of transistor 130, and resistor 136 is located across the base region of transistor 140 and the collector region of transistor 150. Resistor 138 represents the resistance of the p-base 118 disposed between $p^+$ region 124 and n-well 116.

Figure 5:
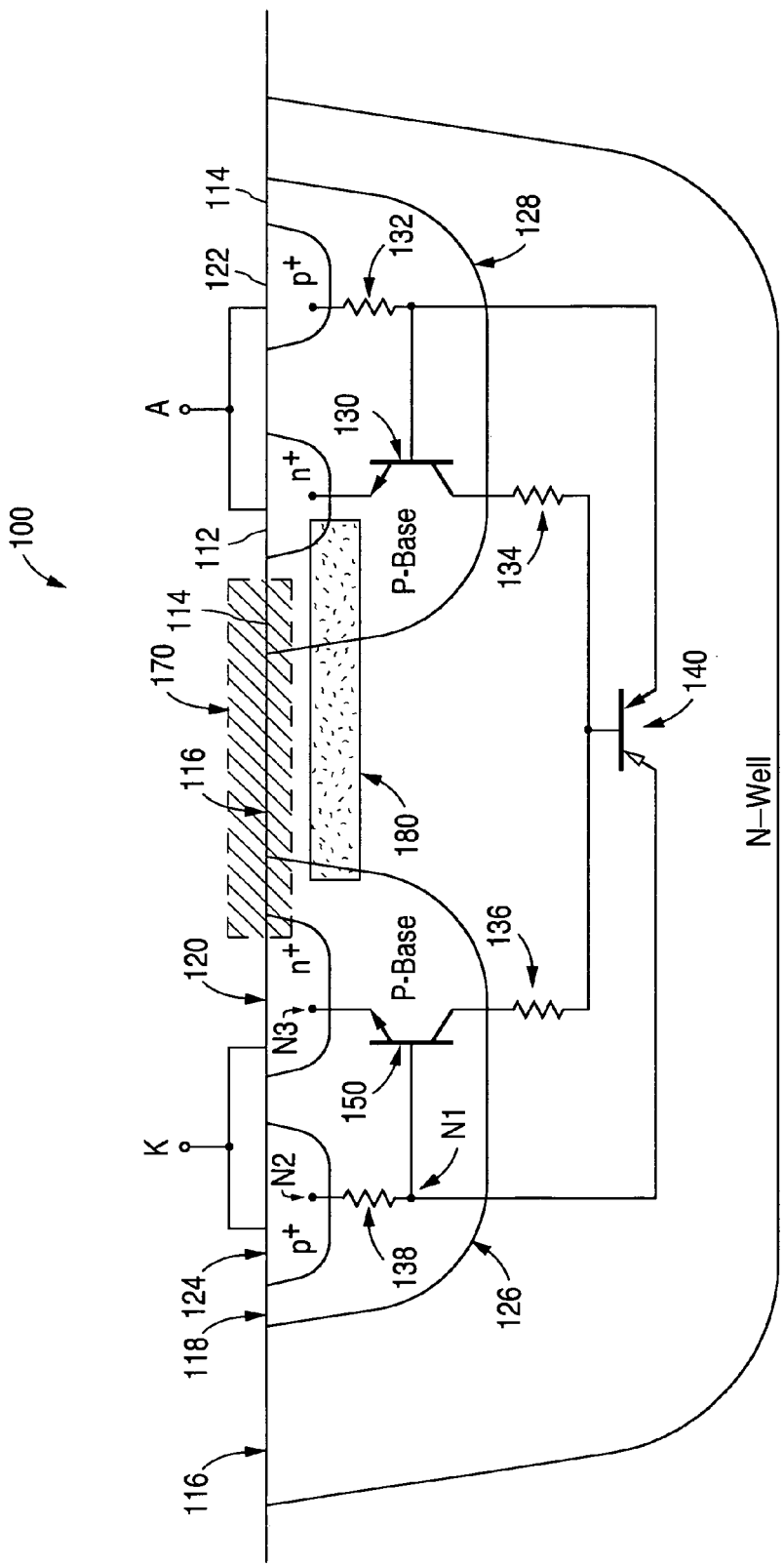
FIG. 5 is a composite of the cross-sectional and the circuit schematic views of FIGS. 3 and 4.

FIG. 5 shows the circuit schematic view of FIG. 4 superimposed on the cross-sectional view of FIG. 3. FIG. 5 assists the reader in understanding the operation of ESD protection structure 100 of the present invention.

Referring to FIG. 5, when a positive pulse is applied across terminals A and K, transistors 140 and 150 turn on. Thereafter thyristor 170, defined by p-n-p-n regions 114, 116, 118 and 120 (only a portion of which is shown in FIG. 5), is triggered into a snap-back mode. Alternatively, when a negative pulse is applied between terminals A and K, transistors 140 and 130 turn on. Subsequently, thyristor 180 defined by p-n-p-n regions 118, 116, 114 and 112 (only a portion of which is shown in FIG. 5), is triggered into a snap-back mode. Only the operation of ESD protection structure 100 during an application of a positive ESD pulse across terminals A and K is discussed. The operation of ESD structure 100 when a negative pulse is applied across terminals A and K can be easily inferred due to ESD protection structure 100's symmetry.

Referring to FIG. 5, when a positive ESD pulse appears across terminals A and K, p-n junction 128 formed between regions 114 and 116 is forward-biased and p-n junction 126 formed between regions 118 and 116 is reverse-biased. When the applied reverse bias across junction 126 exceeds a threshold value, junction 126 enters into a reverse breakdown region thereby generating electron-hole pairs. The holes thus generated accelerate toward $p^+$ region 124 and are collected by terminal K. As the holes drift toward $p^+$ region 124, a voltage potential develops across resistor 138 between nodes N1 and N2. Because $p^+$ region 124 and $n^+$ region 120 are both connected to terminal K, the voltage across nodes N1 and N2 also appears across nodes N1 and N3. When the voltage across nodes N1 and N3 exceeds a certain value, the base-to-emitter junction of npn bipolar transistor 150 is forward-biased thereby turning on npn transistor 150.

As is seen from FIG. 5, resistor 136 is connected across the collector region of transistor 150 and the base region of transistor 140. Therefore, as transistor 150 turns on, the collector current of transistor 150, which provides the current to the base region of pnp transistor 140, increases. Subsequently, as the voltage across the base-emitter junction of transistor 140 falls below a certain limit, transistor 140 turns on. Once both transistors 150 and 140 are turned on, thyristor 170 is triggered into a snap-back mode, resulting in the formation of a very low impedance path between terminals A and K to discharge the ESD current and thereby dissipate the electrical energy associated with the ESD voltage. This protects the IC against the potential damage of the ESD pulse.

Figure 6:
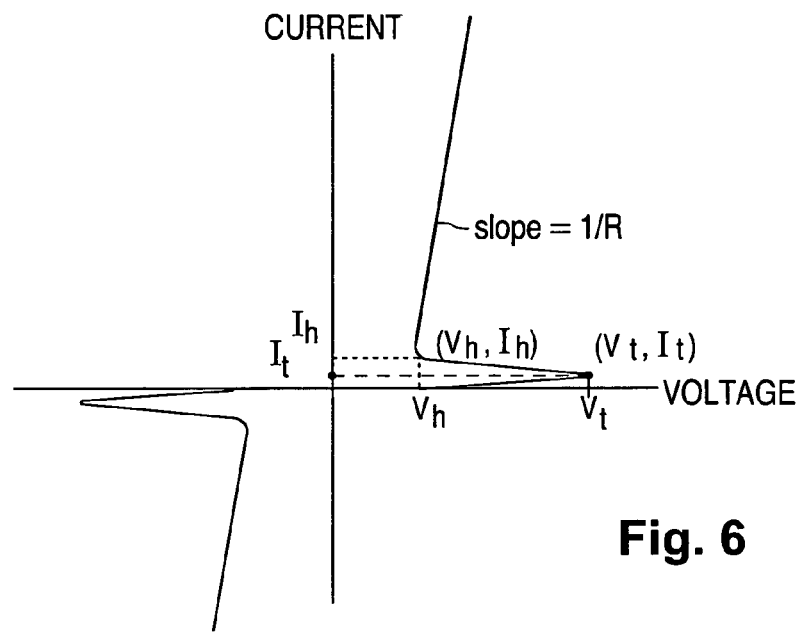
FIG. 6 shows the current-voltage characteristic of the ESD protection structure of the present invention.

FIG. 6 shows the current-voltage (I-V) characteristic of p-n-p-n thyristor 170 of FIG. 5. As the voltage across the two terminals of thyristor 170 increases, the current flow through thyristor 170 increases until the point marked by the I-V coordinates ($V_t$, $I_t$), known in the art as the trigger point, is reached. If the voltage across the two terminals increases beyond the trigger voltage, the thyristor enters into a snapback mode. Thereafter, a low impedance path between the two terminals is formed requiring a much lower voltage to sustain the current flow. Consequently, the voltage across the p-n-p-n device decreases to a new value $V_h$, commonly known in the art as the holding voltage. The I-V coordinates of the holding point are shown in FIG. 6 as ($V_h$, $I_h$). Once the holding voltage is reached, any increase in the voltage across the p-n-p-n device results in a sharp increase in the current through the device. As is seen from FIG. 6, the slope of the I-V characteristic of the device beyond the holding point is very sharp, signifying the high conductance of the device in this deep snap-back region.

The I-V characteristic of the p-n-p-n device between the trigger voltage $V_t$ and the holding voltage $V_h$ has a negative slope, indicating the fact that the device exhibits a negative resistance in this region.

Both the trigger voltage and the holding voltage are important parameters in the operation of a p-n-p-n device. The trigger voltage must be exceeded before the snap-back occurs, and the holding voltage must be exceeded before the device exhibits a very low resistance. In some embodiments of the present invention the resistance exhibited beyond the holding voltage is approximately 1 to 2 ohms.

Referring to FIG. 5, the low impedance current discharge path across terminals A and K of ESD protection structure 100 during an applied positive voltage/current ESD pulse is as follows. The current flows from terminal A, through resistor 132, into the emitter and the collector regions of transistor 140 and, subsequently, into the base region of transistor 150. Thereafter, the current enters the emitter region of transistor 150 and finally exits structure 100 through terminal K.

When a negative voltage/current ESD pulse appears across terminals A and K of ESD protection structure 100, thyristor 180 is triggered into a snap-back region. The resulting low impedance current discharge path formed between terminals A and K is as follows. The ESD current flows from terminal K and, after passing through resistor 138, flows into the emitter and the base regions of transistor 140 and, subsequently, enters the collector region of transistor 130. Thereafter, the current enters the emitter region of transistor 130 and finally exits structure 100 through terminal A.

Therefore, a single ESD protection structure 100, in accordance with the present invention, advantageously provides protection against both positive and negative ESD pulses.

Figure 7:
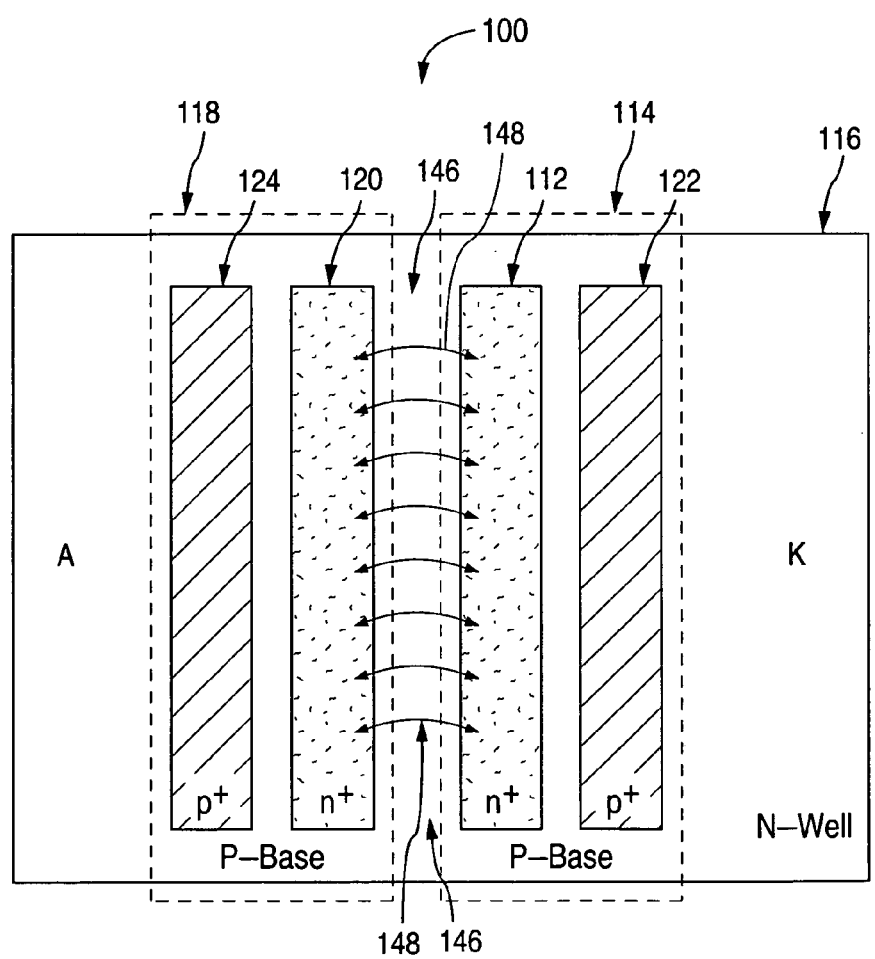
FIG. 7 shows a top view of the dual-direction ESD protection structure of FIG. 3 as well as the path of a current flow between adjacent p-base regions thereof during an ESD pulse.

FIG. 7 shows a top view of the ESD protection structure 100 of the present invention. When an ESD pulse arrives between terminals A and K, current flows between p-base 114 and p-base 118 across section 146 of n-well 116, as shown by solid arrows 148. Therefore, as is seen from FIG. 7, the amount of the current flow is limited to that which crosses only a single edge of each of the p-base regions 114 and 118. In order to increase the amount of current handling capability—hence to increase the ESD protection—prior art techniques add more p-base regions 114 or 118 so as to allow for the addition of more rectangle-shaped $p^+$ and $n^+$ regions, which are commonly referred to in the art as finger structures. The conventional technique of adding more $p^+$ and $n^+$ fingers gives rise to a significant increase in the amount of the substrate surface area consumed without a proportional increase in the ESD protection of the resulting structure. Therefore, it is important to develop an ESD protection structure which more efficiently utilizes the substrate surface area to provide a current handling capability that is greater than those known in the prior art.

In accordance with the present invention, to increase the current handling capability and hence the degree of ESD protection that a given area of a substrate surface provides, three building block cells, namely a corner cell, a center cell and an edge cell are developed. FIGS. 8A-10A and 8B-10B show the top views and the cross-sectional views of a corner cell 300, a center cell 400 and an edge cell 500, respectively. The top views of the three building block cells have square geometrical shapes with identical areas.

Figure 8A:
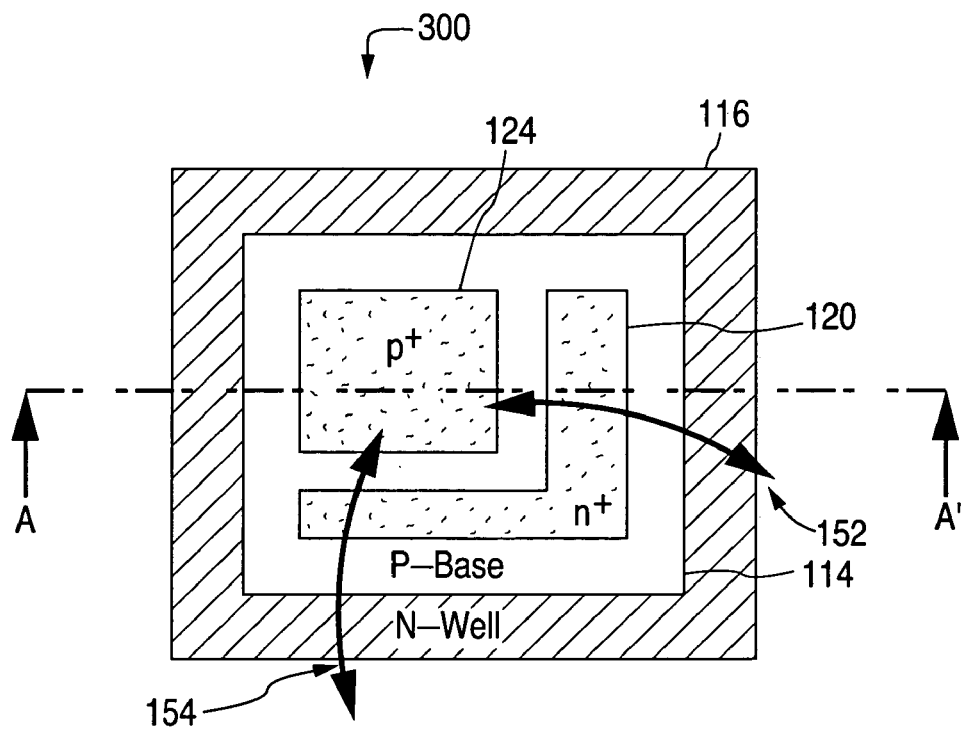
FIG. 8A shows a top view of a corner cell forming the corner regions of a current-enhanced ESD protection structure, in accordance with the present invention.
Figure 8B:
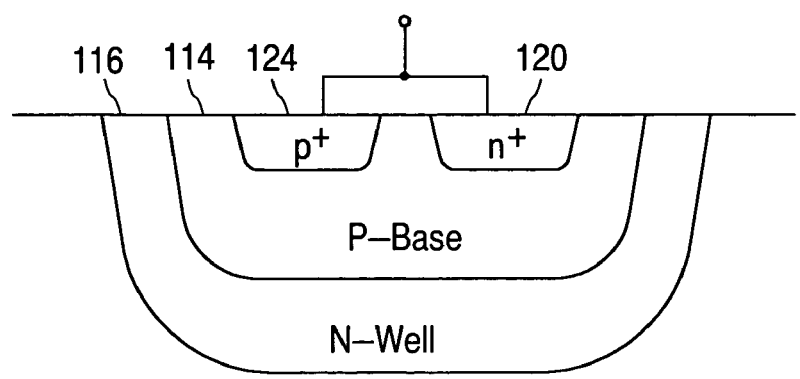
FIG. 8B shows a cross-sectional view of the corner cell of FIG. 10A.
Figure 9A:
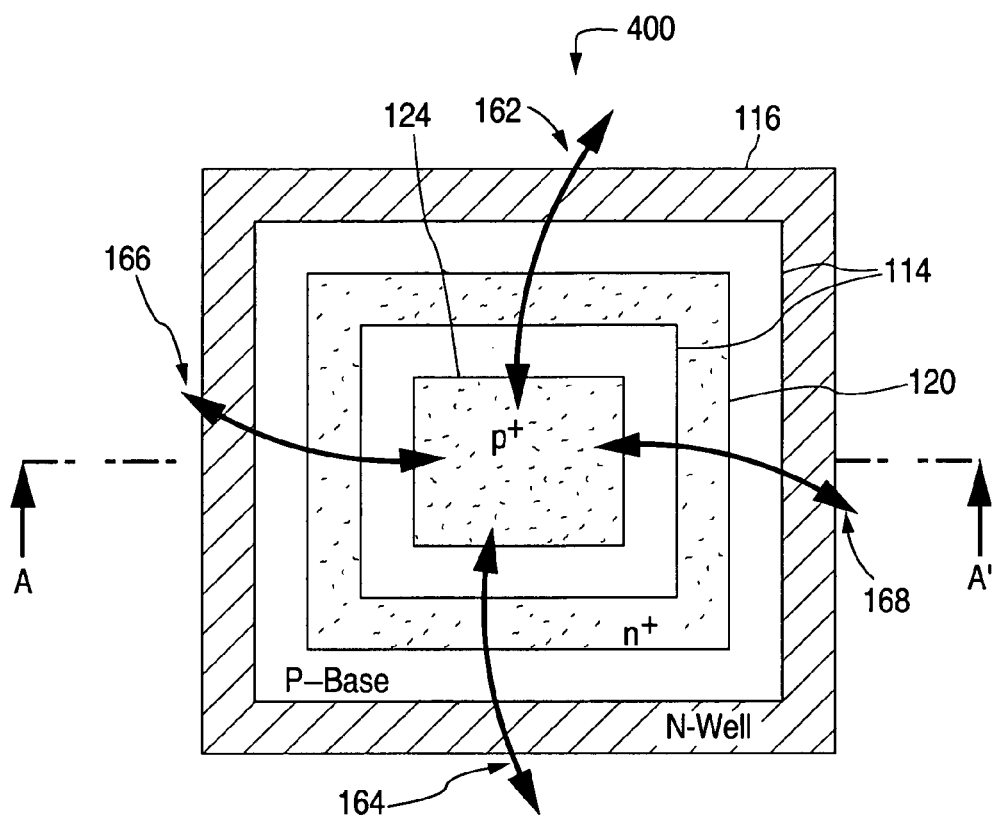
FIG. 9A shows a top view of a center cell forming the center regions of a current-enhanced ESD protection structure, in accordance with the present invention.
Figure 9B:
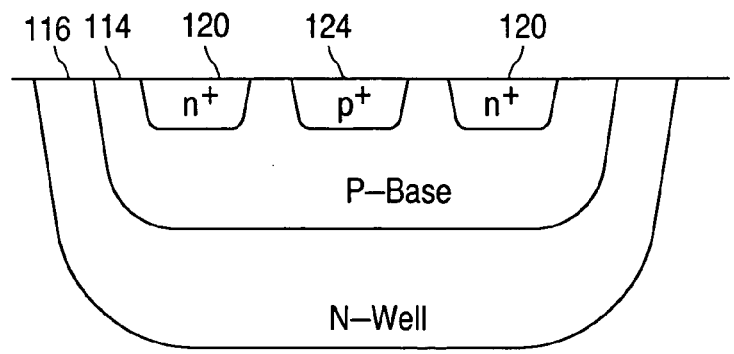
FIG. 9B shows a cross-sectional view of the center cell of FIG. 9A.
Figure 10A:
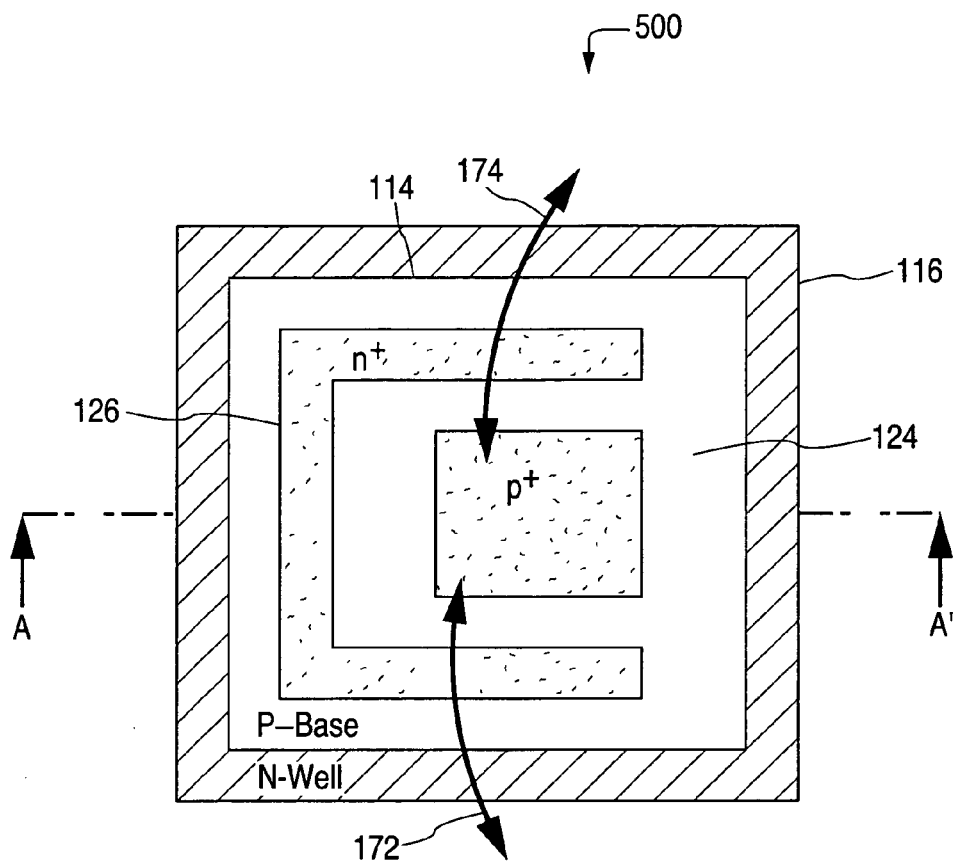
FIG. 10A shows a top view of an edge cell forming the edges of a current-enhanced ESD protection structure, in accordance with the present invention.
Figure 10B:
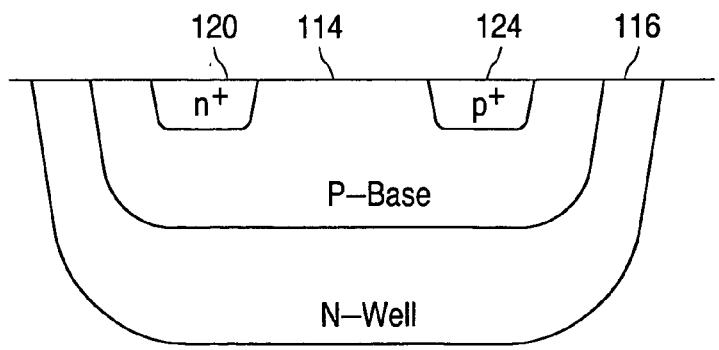
FIG. 10B shows a cross-sectional view of the edge cell of FIG. 10A.

From FIG. 8A it is seen that corner cell 300 provides current flow either to or from $p^+$ region 124 along the two directions marked by solid arrows 152 and 154. From FIG.

9A, it is seen that center cell 400 provides current flow either to or from p+ region 124 along the four directions marked by solid arrows 162, 164, 166 and 168. From FIG. 10A it is seen that edge cell 500 provides current flow either to or from p+ region 124 along the two directions marked by solid arrows 172 and 174. As their names imply, corner cell 300, center cell 400 and edge cell 500 are disposed in the corner locations, the center locations and the edge locations of a current-enhanced square-shaped ESD protection structure, in accordance with the present invention.

Figure 11A:
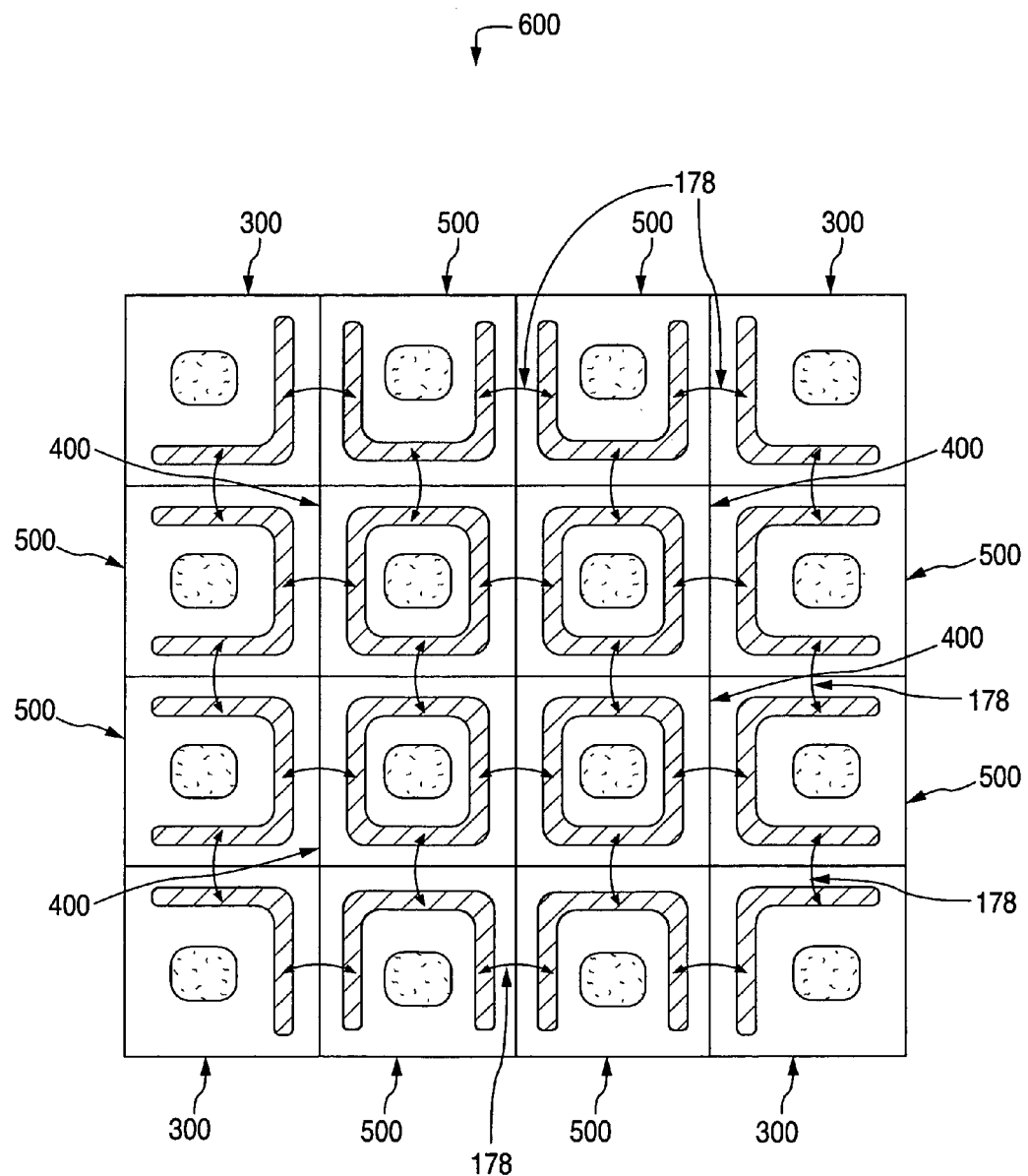
FIG. 11A shows a top view of a first embodiment of a current-enhanced ESD protection structure, in accordance with the present invention, constructed using the corner, center and edge cells of FIGS. 8A, 9A and 10A.

FIG. 11A shows a top view of embodiment 600 of the current-enhanced ESD protection structure of the present invention. Embodiment 600 is composed of four center cells 300, four corner cells 400 and eight edge cells 500. Because of the identical sizes of the cells, embodiment 600 has a square shape. Solid arrows 178 in FIG. 11A designate the directions in which currents flow during an ESD pulse. Arrows 178 in FIG. 11A variously correspond to (a) arrows 152 and 154 in FIG. 8A, (b) arrows 162, 164, 166 and 168 in FIG. 9A, and (c) arrows 172 and 174 in FIG. 10A. As is seen from FIG. 11A, depending on the cell types, the current flow between adjacent cells occurs along either two, three or four directions. In contrast, the ESD protection structure of FIG. 7, constructed using conventional layout techniques, provides a current flow between adjacent cells along only one direction. Therefore, ESD protection structure 600 has an enhanced current handling capability and, as such, given identical substrate surface areas, provides a substantially greater degree of ESD protection than does ESD protection structure 100 of FIG. 7.

Figure 11B:
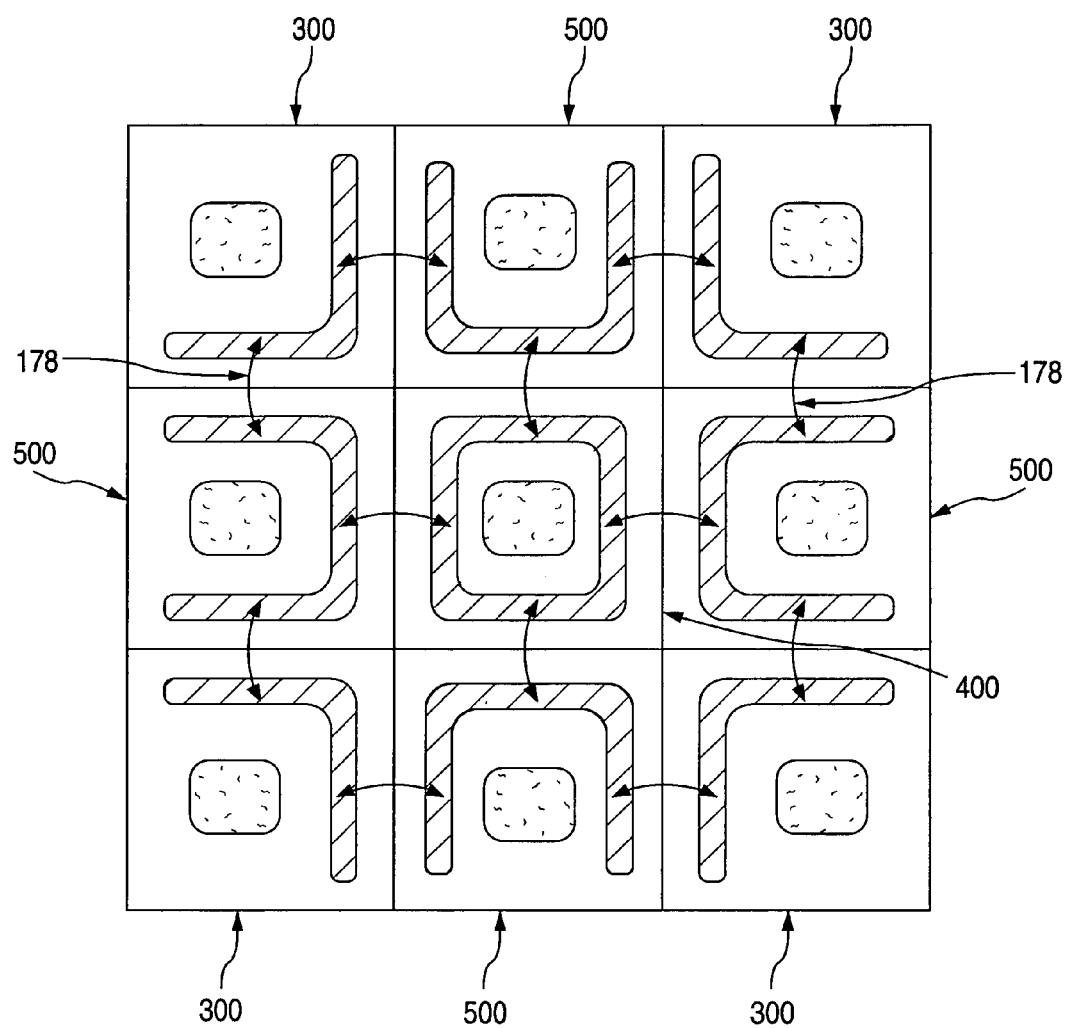
FIG. 11B shows a top view of a second embodiment of a current-enhanced ESD protection structure, constructed using the corner, center and edge cells of FIGS. 8A, 9A and 10A.

Advantageously, because of the square geometrical shapes and the modular construct of the building block cells, it is possible to vary the degree of ESD protection desired by merely increasing or decreasing the number of such cells used in forming a current-enhanced ESD protection structure. For instance, if a smaller current handling capability and ESD protection is adequate, four corner cells 300, one center cell 400 and four edge cells 600 are used to construct a current enhanced ESD protection structure, as shown in FIG. 11B.

The exemplary embodiments of the invention described above are illustrative and not limitative. Other embodiments of this invention obvious to those skilled in the art are intended to fall within the scope of the appended claims. For example, the conductivity types of the various semiconductor regions can be reversed. Regions 112 and 120 then become p+ regions. Region 116 becomes a p-well. Regions 114 and 118 become n-bases. Regions 122 and 124 become n+ regions. The substrate becomes an n-substrate.

We claim:

1. A method comprising:
providing an electrostatic discharge (ESD) protection structure in an integrated circuit formed from a semiconductor body having a substrate region of a first conductivity type wherein the ESD protection structure comprises (a) a first semiconductor region of a second conductivity type connected to a first terminal, the second conductivity type being opposite to the first conductivity type, (b) a second semiconductor region of the first conductivity type connected to the first terminal and continuous with the first semiconductor region, (c) an electrically floating third semiconductor region of the second conductivity type continuous with the second semiconductor region and separated from the first semiconductor region by the second semiconductor region, (d) a fourth semiconductor region of the first conductivity type connected to a second terminal, continuous with the third semiconductor region, spaced apart from the first semiconductor region, and separated from the second semiconductor region by the third semiconductor region, and (e) a fifth semiconductor region of the second conductivity type connected to the second terminal, continuous with the fourth semiconductor region, spaced apart from the first and second semiconductor regions, and separated from the third semiconductor region by the fourth semiconductor region, the second and fourth semiconductor regions being separated from the substrate region by the third semiconductor region; and
subjecting the integrated circuit to a voltage of magnitude greater than a trigger value such that the voltage is placed across the first and second terminals and such that current dissipating electrical energy associated with the voltage automatically flows through the ESD protection structure when the voltage is placed across the first and second terminals
wherein the third semiconductor region forms, with the second and fourth semiconductor regions, respective pn junctions having respective reverse breakdown voltages whose magnitudes solely determine the trigger value; and
current flows from either terminal through the ESD protection structure to the other terminal substantially only when the voltage across the first and second terminals exceeds the trigger value.

2. A method as in claim 1 wherein the voltage arises from ESD between the first and second terminals.

3. A method as in claim 1 wherein the ESD protection structure enters a snap-back condition when the magnitude of the voltage across the first and second terminals becomes greater than the trigger value.

4. A method as in claim 3 wherein the ESD protection structure exhibits a resistance of 1-2 ohms between the first and second terminals when the ESD protection structure is in the snap-back condition.

5. A method as in claim 1 wherein:
the semiconductor body has a major surface to which the first through fifth semiconductor regions extend;
the second semiconductor region substantially surrounds the first semiconductor region except along the major surface; and
the fourth semiconductor region substantially surrounds the fifth semiconductor region except along the major surface.

6. A method as in claim 5 wherein the third semiconductor region substantially surrounds the second and fourth semiconductor regions except along the major surface.

7. A method as in claim 6 wherein the substrate region substantially surrounds the third semiconductor region except along the major surface.

8. A method as in claim 1 wherein the providing act includes providing each of the second and fourth semiconductor regions as a main portion and a contact portion more heavily doped than the main portion such that the contact portions of the second and fourth semiconductor regions respectively contact the first and second terminals.

9. A method as in claim 8 wherein the voltage arises from ESD between the first and second terminals.

10. A method as in claim 8 wherein the ESD protection structure enters a snap-back condition when the magnitude of the voltage across the first and second terminals becomes greater than the trigger value.

11. A method as in claim 10 wherein the ESD protection structure exhibits a resistance of 1-2 ohms between the first and second terminals when the ESD protection structure is in the snap-back condition.

12. A method as in claim 8 wherein the contact portion of the second semiconductor region is spaced apart from the first semiconductor region, and the contact portion of the fourth semiconductor region is spaced apart from the fifth semiconductor region.

13. A method as in claim 8 wherein:
the semiconductor body has a major surface to which the first through fifth semiconductor regions extend;
the second semiconductor region substantially surrounds the first semiconductor region except along the major surface; and
the fourth semiconductor region substantially surrounds the fifth semiconductor region except along the major surface.

14. A method as in claim 13 wherein:
the main portion of the second semiconductor region also substantially surrounds its contact portion except along the major surface; and
the main portion of the fourth semiconductor region also substantially surrounds its contact portion except along the major surface.

15. A method as in claim 13 wherein the third semiconductor region substantially surrounds the second and fourth semiconductor regions except along the major surface.

16. A method as in claim 15 wherein the substrate region substantially surrounds the third semiconductor region except along the major surface.

17. A method as in claim 8 wherein the first and fifth semiconductor regions are both situated at least partially between the contact portions of the second and fourth semiconductor regions.

18. A method as in claim 8 wherein:
the first semiconductor region is closer to the fifth semiconductor region than to the contact portion of the fourth semiconductor region; and
the fifth semiconductor region is closer to the first semiconductor region than to the contact portion of the second semiconductor region.

19. A method as in claim 18 wherein:
the semiconductor body has a major surface to which the first through fifth semiconductor regions extend;
the first and fifth semiconductor regions and the contact portions of the second and fourth semiconductor regions are shaped generally like rectangles along the major surface; and
the rectangles of the first and fifth semiconductor regions along the major surface are situated at least partially between the rectangles of the contact portions of the second and fourth semiconductor regions along the major surface.

20. A method as in claim 19 wherein:
the rectangles of the first and fifth semiconductor regions along the major surface are largely identical to each other; and
the rectangles of the contact portions of the second and fourth semiconductor regions along the major surface are largely identical to each other.

21. A method as in claim 8 wherein the first and second semiconductor regions and the contact region of the second semiconductor region are in a substantially symmetrical geometrical structure respectively with the fifth and fourth semiconductor regions and the contact region of the fourth semiconductor region along an imaginary line that extends vertically through the third semiconductor region at a location halfway between the second and fourth semiconductor regions.

22. A method as in claim 1 wherein the first and second conductivity types respectively are n-type and p-type.

23. A method as in claim 1 wherein the first and second conductivity types respectively are p-type and n-type.

24. A method as in claim 1 wherein:
the semiconductor body has a major surface to which the first through fifth semiconductor regions extend;
the third semiconductor region substantially surrounds the second and fourth semiconductor regions except along the major surface; and
each of the second and fourth semiconductor regions consists substantially of main semiconductor material and further semiconductor material doped more heavily than the main semiconductor material, substantially surrounded by the main semiconductor material except along the major surface, and having a periphery continuous with the main semiconductor material substantially everywhere except along the major surface.

25. A method as in claim 24 wherein the voltage arises from ESD between the first and second terminals.

26. A method as in claim 24 wherein the ESD protection structure enters a snap-back condition when the magnitude of the voltage across the first and second terminals becomes greater than the trigger value.

27. A method as in claim 26 wherein the ESD protection structure exhibits a resistance of 1-2 ohms between the first and second terminals when the ESD protection structure is in the snap-back condition.

28. A method as in claim 24 wherein the further semiconductor material of the second semiconductor region is spaced apart from the first semiconductor region, and the further semiconductor material of the fourth semiconductor region is spaced apart from the fifth semiconductor region.

29. A method as in claim 24 wherein:
the further semiconductor material of the second semiconductor region consists of a contact portion that contacts the final terminal; and
the further semiconductor material of the fourth semiconductor region consists of a contact portion that contacts the second terminal.

30. A method as in claim 29 wherein the further semiconductor material of the second semiconductor region is spaced apart from the first semiconductor region, and the further semiconductor material of the fourth semiconductor region is spaced apart from the fifth semiconductor region.

31. A method as in claim 24 wherein the first and second semiconductor regions and the further material of the second semiconductor region are in a substantially symmetrical geometrical structure respectively with the fifth and fourth semiconductor regions and the further material of the fourth semiconductor region along an imaginary line that extends vertically through the third semiconductor region at a location halfway between the second and fourth semiconductor regions.

32. A method as in claim 1 wherein:
the semiconductor body has a major surface to which the first through fifth semiconductor regions extend;
the third semiconductor region substantially surrounds the second and fourth semiconductor regions except along the major surface;
each of the second and fourth semiconductor regions consists substantially of main semiconductor material and further semiconductor material doped more heavily than the main semiconductor material;

the further semiconductor material of the second semiconductor region consists of a contact portion that contacts the first terminal; and the further semiconductor material of the fourth semiconductor region consists of a contact portion that contacts the second terminal.

33. A method as in claim 32 wherein the voltage arises from ESD between the first and second terminals.

34. A method as in claim 32 wherein the ESD protection structure enters a snap-back condition when the magnitude of the voltage across the first and second terminals becomes greater than the trigger value.

35. A method as in claim 34 wherein the ESD protection structure exhibits a resistance of 1-2 ohms between the first and second terminals when the ESD protection structure is in the snap-back condition.

36. A method as in claim 32 wherein the further semiconductor material of the second semiconductor region is spaced apart from the final semiconductor region, and the further semiconductor material of the fourth semiconductor region is spaced apart from the fifth semiconductor region.

37. A method as in claim 32 wherein the first and second semiconductor regions and the further material of the second semiconductor region are in a substantially symmetrical geometrical structure respectively with the fifth and fourth semiconductor regions and the further material of the fourth semiconductor region along an imaginary line that extends vertically through the third semiconductor region at a location halfway between the second and fourth semiconductor regions.

38. A method as in claim 1 wherein the first and second semiconductor regions are in a substantially symmetrical geometrical structure respectively with the fifth and fourth semiconductor regions along an imaginary line that extends vertically through the third semiconductor region at a location halfway between the second and fourth semiconductor regions.

39. A method as in claim 1 wherein the first, second, fourth, and fifth semiconductor regions are spaced apart from the substrate region.

40. A method as in claim 1 wherein the third semiconductor region is continuous with the substrate region.

* * * * *